(12) United States Patent
Ogata et al.

(10) Patent No.: US 9,608,194 B2
(45) Date of Patent: Mar. 28, 2017

(54) PIEZOELECTRIC DEVICE AND PRODUCTION METHOD FOR GREEN COMPACT BEING MOLDED BODY OF PIEZOELECTRIC DEVICE PRIOR TO SINTERING

(71) Applicant: NGK Insulators, Ltd., Nagoya (JP)

(72) Inventors: Takatomo Ogata, Nagoya (JP); Haruhiko Ito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 744 days.

(21) Appl. No.: 14/037,956

(22) Filed: Sep. 26, 2013

(65) Prior Publication Data

US 2014/0021830 A1    Jan. 23, 2014

Related U.S. Application Data

(63) Continuation of application No. PCT/JP2012/054309, filed on Feb. 22, 2012.

(30) Foreign Application Priority Data

Mar. 28, 2011    (JP) ................................ 2011-069132

(51) Int. Cl.
| | | |
|---|---|---|
| *H01L 41/083* | (2006.01) | |
| *H01L 41/22* | (2013.01) | |
| *H01L 41/273* | (2013.01) | |
| *H01L 41/293* | (2013.01) | |
| *H01L 41/297* | (2013.01) | |
| *H01L 41/047* | (2006.01) | |
| *H01L 41/08* | (2006.01) | |
| *G01L 1/16* | (2006.01) | |

(52) U.S. Cl.
CPC ................ *H01L 41/22* (2013.01); *G01L 1/16* (2013.01); *H01L 41/0471* (2013.01);
(Continued)

(58) Field of Classification Search
CPC ..... H01L 41/083; H01L 41/22; H01L 41/273; H01L 41/293; H01L 41/297; H01L 41/0471; H01L 41/0472
(Continued)

(56) References Cited

U.S. PATENT DOCUMENTS

| | | | |
|---|---|---|---|
| 5,296,262 A | 3/1994 | Didden | |
| 2003/0008536 A1* | 1/2003 | Whelan | ................. H01L 41/083 439/86 |

(Continued)

FOREIGN PATENT DOCUMENTS

| | | |
|---|---|---|
| JP | 04-309274 A1 | 10/1992 |
| JP | 06-021528 A1 | 1/1994 |

(Continued)

OTHER PUBLICATIONS

International Search Report and Written Opinion dated Mar. 27, 2012.

*Primary Examiner* — J. San Martin
(74) *Attorney, Agent, or Firm* — Burr & Brown, PLLC

(57) ABSTRACT

A plurality of piezoelectric device corresponding parts including a green main body part and a green top surface electrode formed on a top surface of the green main body part are placed on a tabular substrate at intervals. Next, a tabular elastic body is pressed from above to the plurality of piezoelectric device corresponding parts, so as to form an inclined part declined toward an outer side in an edge of a top surface of each piezoelectric device corresponding part, and to form a circular arc part at an intersection between the inclined part and a side surface of the piezoelectric device corresponding part. Next, a green side surface electrode is formed on the side surface of each piezoelectric device corresponding part so that the green side surface electrode is connected to the green top surface electrode. Next, this molded body is sintered so that a piezoelectric device is obtained.

17 Claims, 12 Drawing Sheets

(52) U.S. Cl.
CPC .......... *H01L 41/0472* (2013.01); *H01L 41/08* (2013.01); *H01L 41/273* (2013.01); *H01L 41/293* (2013.01); *H01L 41/297* (2013.01); *G03B 2205/0061* (2013.01); *Y10T 29/42* (2015.01)

(58) Field of Classification Search
USPC ....................................................... 310/328
See application file for complete search history.

(56) References Cited

U.S. PATENT DOCUMENTS

| | | | | |
|---|---|---|---|---|
| 2006/0125354 A1* | 6/2006 | Boecking | ............ | H01L 41/0833 310/367 |
| 2006/0132001 A1* | 6/2006 | Sugg | ................... | H01L 41/0533 310/366 |
| 2006/0132002 A1* | 6/2006 | Boecking | ............ | H01L 41/0471 310/367 |
| 2015/0116901 A1* | 4/2015 | Sasaoka | ................... | H01G 4/30 361/301.4 |
| 2015/0122908 A1* | 5/2015 | Kawamura | ......... | H01L 41/0472 239/102.2 |

FOREIGN PATENT DOCUMENTS

| | | | |
|---|---|---|---|
| JP | 08-306979 | A1 | 11/1996 |
| JP | 10-241993 | A1 | 9/1998 |
| JP | 2002-359148 | A1 | 12/2002 |
| JP | 2006-100805 | A1 | 4/2006 |
| JP | 2006100805 | A * | 4/2006 |
| JP | 2006-159410 | A1 | 6/2006 |
| JP | 2010226128 | A * | 10/2010 |

* cited by examiner

LAMINATED BODY
PIEZOELECTRIC DEVICE CORRESPONDING PART    SUBSTRATE

PIEZOELECTRIC DEVICE CORRESPONDING PART    SUBSTRATE

PIEZOELECTRIC DEVICE AND PRODUCTION METHOD FOR GREEN COMPACT BEING MOLDED BODY OF PIEZOELECTRIC DEVICE PRIOR TO SINTERING

BACKGROUND OF THE INVENTION

Field of the Invention

The present invention relates to a piezoelectric device, which is a sintered body including a main body part including a part made of a piezoelectric material, a top surface electrode that covers at least a part of a top surface part of the main body part, a bottom surface electrode that covers at least a part of a bottom surface part of the main body part, and a side surface electrode that covers at least a part of a side surface part of the main body part and connects the top surface electrode to the bottom surface electrode. The piezoelectric device is also referred to as a piezoelectric/electrostrictive device.

Description of Related Art

This type of piezoelectric device has been developed actively for a position control device for an optical lens (for example, an ultrasonic motor for auto-focusing or zooming of a camera), a position control device for a read and/or write element for magnetic information or the like (for example, an actuator for a magnetic head of a hard disk drive), a sensor for converting mechanical vibration into an electrical signal, or the like (see, for example, JP 2006-100805 A and JP 2002-359148 A).

The above-mentioned piezoelectric device is produced in accordance with the following procedure, for example. A state "prior to sintering" is hereinafter expressed by prefixing "green" to a name of a corresponding member.

First, on a tabular substrate, there is formed one large tabular green compact including parts corresponding to the piezoelectric devices prior to sintering (hereinafter referred to as "green piezoelectric device corresponding parts") that are aligned at predetermined intervals.

Next, a machining process such as a cutting process or a punching process is performed on the large green compact placed on the substrate. As a result, there is obtained a state where a plurality of green piezoelectric device corresponding parts are placed at predetermined intervals on the substrate. Each green piezoelectric device corresponding part includes a green main body part that corresponds to a main body part, and a green top surface electrode and a green bottom surface electrode that are formed on top and bottom surfaces of the green main body part and correspond to a top surface electrode and a bottom surface electrode, respectively.

Next, at a predetermined place of a side surface of each green piezoelectric device corresponding part (namely, a surface exposed by the machining process), a green side surface electrode that corresponds to a side surface electrode is formed so as to connect the green top surface electrode to the green bottom surface electrode. Then, the plurality of green piezoelectric device corresponding parts are sintered. As a result, the plurality of piezoelectric devices (after sintering) can be obtained in the same process.

Here, as described above, in a case of adopting the method of obtaining the plurality of green piezoelectric device corresponding parts by performing a machining process such as a cutting process or a punching process on one large tabular green compact, there may occur such a situation that a sharp angle shape or a burr is generated at an intersection part between the top surface and the side surface of the obtained green piezoelectric device corresponding part (at an edge of the top surface).

In a state where the above-mentioned situation has occurred, if the step of forming the green side surface electrode is carried out, there is a tendency that a film thickness of the green side surface electrode becomes relatively small at a "part in a vicinity of a boundary between the green top surface electrode and the green side surface electrode." Therefore, after sintering, there is a tendency that a film thickness of the side surface electrode becomes small at a part in a vicinity of a boundary between the top surface electrode and the side surface electrode. As a result, there may occur a problem in that a conduction failure is liable to occur between the top surface electrode and the side surface electrode.

In order to deal with this problem, grinding or the like may be performed on the edge of the top surface of the green piezoelectric device corresponding part before the step of forming the green side surface electrode so as to remove the above-mentioned sharp angle shape or burr. However, if a size of the piezoelectric device is very small, it is very difficult to perform the grinding or the like.

SUMMARY OF INVENTION

It is an object of the present invention to provide a piezoelectric device in which conduction failure hardly occurs between a top surface electrode (or a bottom surface electrode) and a side surface electrode, and to provide a simple production method for a molded body of the piezoelectric device prior to sintering (green compact).

In order to achieve the above-mentioned object, the feature of a piezoelectric device according to one embodiment of the present invention resides in that Tb/Ta is 1.0 to 5.0, where Ta represents a thickness at a part of the side surface electrode where the thickness becomes minimum, and Tb represents a thickness at a part of the side surface electrode where a radius of curvature of a surface thereof becomes minimum. In this case, the part of the side surface electrode where the thickness becomes minimum is, for example, a center part of the side surface electrode in an up and down direction, and the part of the side surface electrode where the radius of curvature of the surface thereof becomes minimum is, for example, a part in a vicinity of a boundary between the side surface electrode and the top surface electrode or the bottom surface electrode.

It is preferred that Tc/Ta be 0.5 to 2.0, where Tc represents a thickness of the top surface electrode or the bottom surface electrode. Further, the main body part may be a laminated body including at least one piezoelectric layer made of the piezoelectric material and at least one internal electrode that are laminated on each other. In this case, the internal electrode is connected to the side surface electrode. The main body part has, for example, a rectangular parallelepiped shape having a depth of 0.2 to 10.0 mm, a width of 0.1 to 10.0 mm, and a height of 0.01 to 10.0 mm. Each of the above-mentioned dimensions is a value after sintering.

According to the study, it was found that the conduction failure between the top surface electrode (or the bottom surface electrode) and the side surface electrode hardly occurred when Tb/Ta was 1.0 to 5.0 as in the structure described above (details are described later).

As a production method for the molded body of the piezoelectric device prior to sintering (green compact) according to the one embodiment of the present invention, the following method may be adopted. First, a plurality of green compacts are placed on a tabular substrate at intervals, the plurality of green compacts each including a green main body part that corresponds to the main body part, a green top surface electrode that is formed on a top surface of the green main body part and corresponds to the top surface electrode.

Next, an elastic body is pressed from above to the plurality of green compacts, so as to form an inclined part declined toward an outer side in an edge of a top surface of each of the plurality of green compacts, and to form a circular arc part at an intersection between the inclined part and a side surface of the each of the plurality of green compacts. After that, a green side surface electrode that corresponds to the side surface electrode is formed on the side surface of the each of the plurality of green compacts so that the green side surface electrode is connected to the green top surface electrode. Note that, the inclined part need not be formed. In this case, the circular arc part is formed at an intersection between the edge of the top surface of the each of the plurality of green compacts and the side surface of the each of the plurality of green compacts.

According to this method, the above-mentioned sharp angle shape or burr can be easily removed in the same process from the edge of the top surface of the each of the plurality of green compacts by pressing the elastic body from above to the plurality of green compacts at a stage prior to the step of forming the green side surface electrode. As a result, there hardly occurs a situation where a film thickness of the green side surface electrode to be formed subsequently becomes relatively small at the "part in a vicinity of a boundary between the green top surface electrode and the green side surface electrode". Therefore, after sintering, there hardly occurs as well a situation where a film thickness of the side surface electrode becomes small at a part in a vicinity of a boundary between the top surface electrode and the side surface electrode. As described above, according to the above-mentioned method, it is possible to produce, with a simple method, the piezoelectric device (molded body thereof prior to sintering) in which conduction failure hardly occurs between the top surface electrode and the side surface electrode.

It is preferred that the plurality of green compacts placed on the substrate have the same height, and the elastic body have a plate-like shape, that the elastic body have a hardness of 15 to 50 in Shore hardness A, and that the elastic body be pressed by a pressure of 5 to 40 kgf/cm$^2$. In this case, the circular arc part may have a radius of 0.002 to 0.020 mm. In addition, when the inclined part is formed, the inclined part may have a length of 0.01 to 1.0 mm when the each of the plurality of green compacts is viewed from above, and the inclined part may have an inclination angle of 0.1 to 15°.

DETAILED DESCRIPTION OF THE INVENTION

Now, a piezoelectric device according to an embodiment of the present invention is described with reference to the drawings.

(Structure)

Figure 1:
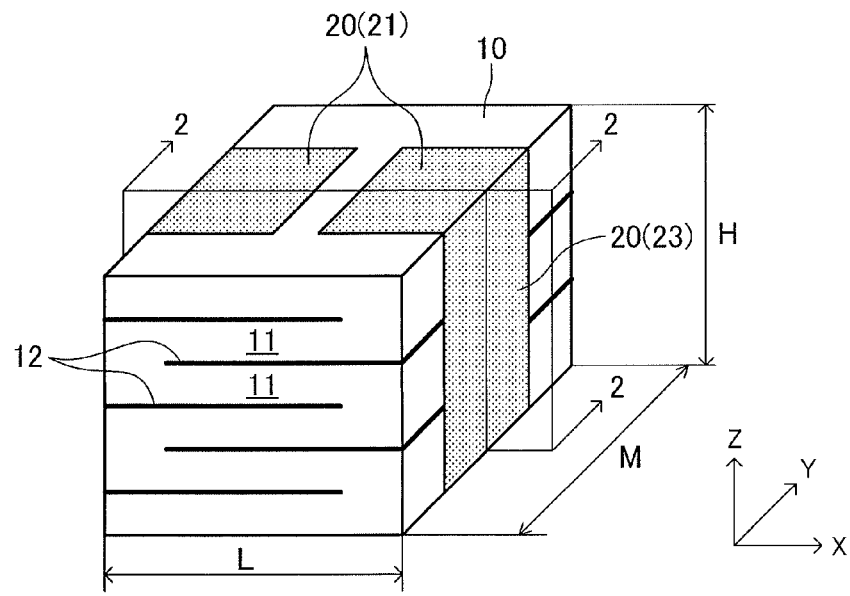
FIG. 1 is a perspective view of a piezoelectric device according to an embodiment of the present invention.
Figure 2:
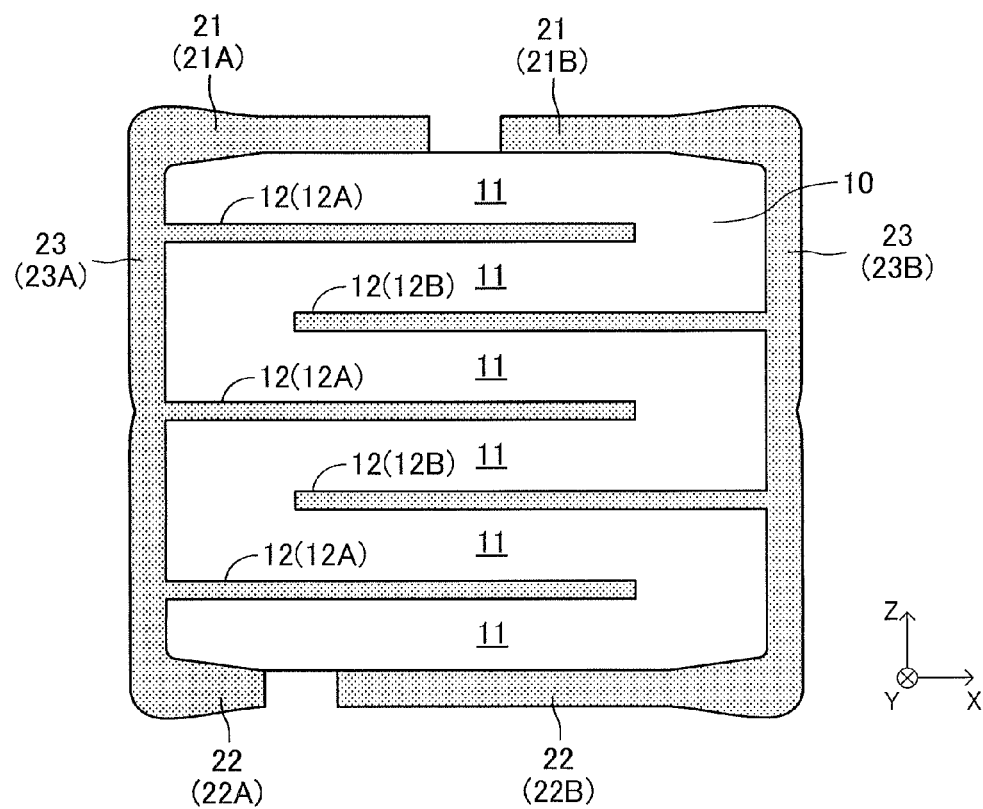
FIG. 2 is a 2-2 cross-sectional view of the piezoelectric device illustrated in FIG. 1.

As illustrated in FIGS. 1 and 2, a piezoelectric device according to this embodiment is a sintered body including a main body part 10 having a rectangular parallelepiped shape, and external electrodes 20 provided on the main body part 10 so as to cover at least a part of the surface of the main body part 10.

The main body part 10 is a laminated body including a plurality of (six, in this example) piezoelectric layers 11 made of a piezoelectric material, and a plurality of (five, in this example) layered internal electrodes 12, in which the piezoelectric layers 11 are disposed as top and bottom layers, and the piezoelectric layers 11 and the internal electrodes 12 are alternately laminated. The piezoelectric layers 11 and the internal electrodes 12 are laminated in parallel to each other. Therefore, the main body part 10 has a top surface part and a bottom surface part, which are flat and parallel to each other. Dimensions of the main body part 10 (after sintering) are 0.2 to 10.0 mm in depth, 0.1 to 10.0 mm in width, and 0.01 to 10.0 mm in height. A thickness of each piezoelectric layer 11 (after sintering) is 1.0 to 100.0 µm, and a thickness of each internal electrode 12 (after sintering) is 0.3 to 5.0 µm.

The external electrode 20 includes a top surface electrode 21 covering a part of a top surface of the main body part 10, a bottom surface electrode 22 covering a part of a bottom surface of the main body part 10, and a side surface electrode 23 that covers a part of a side surface of the main body part 10 and connects the top surface electrode 21 to the bottom surface electrode 22. The side surface electrode 23 is electrically connected to the internal electrode 12, the top surface electrode 21, and the bottom surface electrode 22. More specifically, as illustrated in FIG. 2, (three) internal electrodes 12A, a top surface electrode 21A, a bottom surface electrode 22A, and a side surface electrode 23A (hereinafter collectively referred to as a "first electrode group") are electrically connected to each other, and (two) internal electrodes 12B, a top surface electrode 21B, a bottom surface electrode 22B, and a side surface electrode 23B (hereinafter collectively referred to as a "second electrode group") are electrically connected to each other.

The first and second electrode groups are connected to each other via the piezoelectric layer 11 as an isolator, and therefore electrically insulated from each other. In other words, the (three) internal electrodes 12A that are electrically connected to each other and the (two) internal electrodes 12B that are electrically connected to each other constitute a comb-like electrode. Further, the internal electrodes are five layers in this example, but the number of layers of the internal electrodes is not limited specifically (may be zero).

As illustrated in FIG. 2 and in FIG. 3 that is a partial enlarged view of FIG. 2, at an edge of the top surface (square frame viewed from above) and an edge of the bottom surface (square frame viewed from below) of the main body part 10, there is formed an inclined part declined toward the outside, and there is formed a circular arc part at an intersection between the inclined part and the side surface of the main body part 10.

A thickness Tc of the top surface electrode 21 (after sintering) is substantially constant at 0.5 to 5.0 μm. A thickness of the bottom surface electrode 22 (after sintering) is the same as the thickness Tc of the top surface electrode 21 (after sintering). In addition, a thickness of the side surface electrode 23 (after sintering) is different depending on a place. In particular, attention is given to a thickness Ta at a part where the thickness of the side surface electrode 23 becomes minimum and a thickness Tb at a part where a radius of curvature of a surface of the side surface electrode 23 becomes minimum. As illustrated in FIG. 3, the part where the thickness of the side surface electrode 23 becomes minimum exists at a center part of the side surface electrode 23 in an up and down direction, and the part where the radius of curvature of the surface of the side surface electrode 23 becomes minimum exists in a vicinity of a boundary between the side surface electrode 23 and the top surface electrode 21 or the bottom surface electrode 22. Tb/Ta is wi small the range of 1.0 to 5.0. In addition, Tc/Ta is wi small the range of 0.5 to 2.0. Further, as understood from FIG. 3, in this specification, a "thickness" of an electrode at a certain position means a "length of a part of the normal included inside the electrode", the normal being drawn from the surface of the electrode at the position.

In this piezoelectric device, a potential difference applied to between the first and second electrode groups is adjusted, and hence a deformation amount of the piezoelectric layer 11 (therefore, the main body part 10) can be controlled. Utilizing this principle, this piezoelectric device can be used as an actuator for controlling a position of an object. As this object, there are an optical lens, a magnetic head, an optical head, and the like. In addition, in this piezoelectric device, a potential difference generated between the first and second electrode groups is changed in accordance with a deformation amount of the piezoelectric layer 11 (therefore, the main body part 10). Utilizing this principle, this piezoelectric device can be used as various sensors such as an ultrasonic sensor, an acceleration sensor, an angular velocity sensor, a shock sensor, and a mass sensor.

A piezoelectric ceramics, an electrostrictive ceramics, a ferroelectric ceramics, or an antiferroelectric ceramics is suitably adopted as the material for the piezoelectric layer 11 (piezoelectric material). Specific examples of the material include a ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like alone or a mixture thereof.

A metal being solid at room temperature and excellent in conductivity is preferred as the material for the external electrode 20 (the top surface electrode 21, the bottom surface electrode 22, and the side surface electrode 23) and the internal electrode 12 (electrode material). For example, there may be adopted metal such as aluminum, titanium, chromium, iron, cobalt, nickel, copper, zinc, niobium, molybdenum, ruthenium, palladium, rhodium, silver, tin, tantalum, tungsten, iridium, platinum, gold, or lead alone or an alloy thereof.

(Production Method)

Next, a production method for the above-mentioned piezoelectric device is described. In the following, being "prior to sintering" is expressed by prefixing "green" to a name of a corresponding member, or by suffixing "g" to a reference numeral of a corresponding member.

Figure 4:
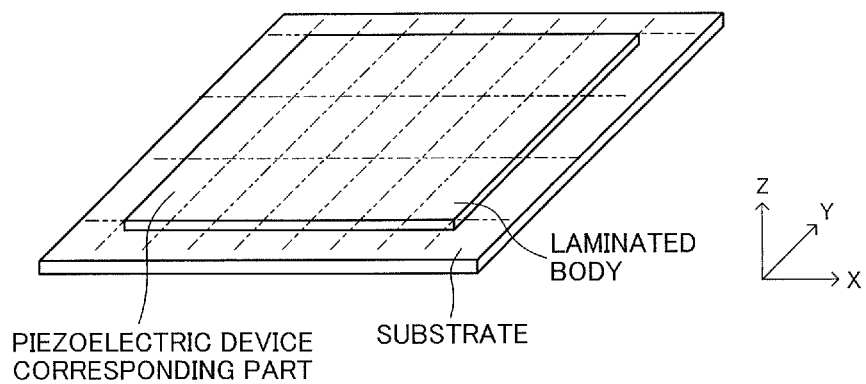
FIG. 4 is a diagram illustrating a state in which a large laminated body formed on a substrate is cut so that multiple piezoelectric device corresponding parts are extracted in the same process.

In this example, first, as illustrated in FIG. 4, there is formed one large green laminated body on a tabular substrate, which includes a plurality of (3×7) parts that correspond to the piezoelectric devices (hereinafter referred to as "green piezoelectric device corresponding parts") and are arranged in a matrix at predetermined intervals. This large green laminated body includes a green laminated body part that corresponds to the main body part 10, a green top surface electrode film that is formed on the top surface of the green laminated body part and corresponds to the top surface electrode 21, and a green bottom surface electrode film that is formed on the bottom surface of the green laminated body part and corresponds to the bottom surface electrode 22.

The green laminated body part that corresponds to the main body part 10 is formed by alternately laminating green piezoelectric sheets corresponding to the piezoelectric layers 11 and green electrode films corresponding to the internal electrodes 12. The green piezoelectric sheet is formed by forming paste containing the piezoelectric material using one of known methods such as a doctor blade method. Formation of the green electrode film on the green piezoelectric sheet is performed by forming paste containing the electrode material using one of known methods such as screen printing. In order to secure pressure contact between the green piezoelectric sheet and the green electrode film, a green adhesion layer may be disposed between the green piezoelectric sheet and the green electrode film. In this case, formation of the green adhesion layer on the green piezoelectric sheet is performed by using one of known methods such as application.

Figure 5:
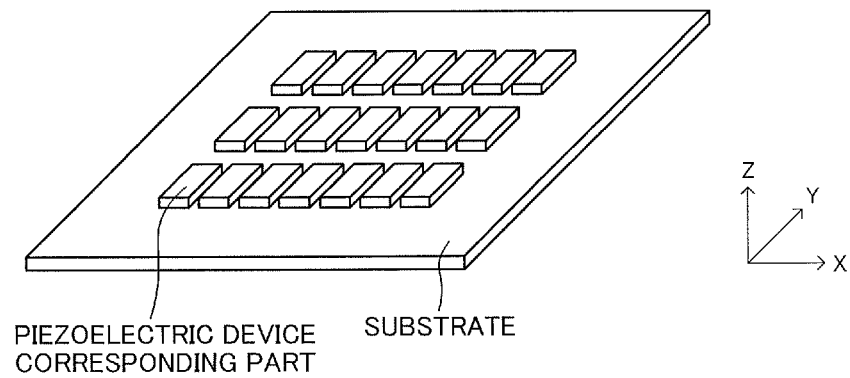
FIG. 5 is a diagram illustrating a state in which the multiple piezoelectric device corresponding parts are extracted on the substrate by cutting.
Figure 6:
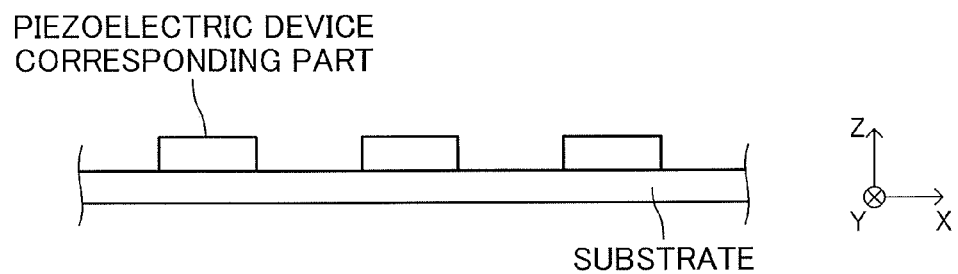
FIG. 6 is a diagram when the state illustrated in FIG. 5 is viewed from side.

Next, a machining process such as a cutting process or a punching process is performed along a cutting line (see double-dot dashed line) illustrated in FIG. 4. As a result, as illustrated in FIGS. 5 and 6, a plurality of (3×7) green piezoelectric device corresponding parts having the same rectangular parallelepiped shape can be extracted by the same process on the substrate.

Figure 7:
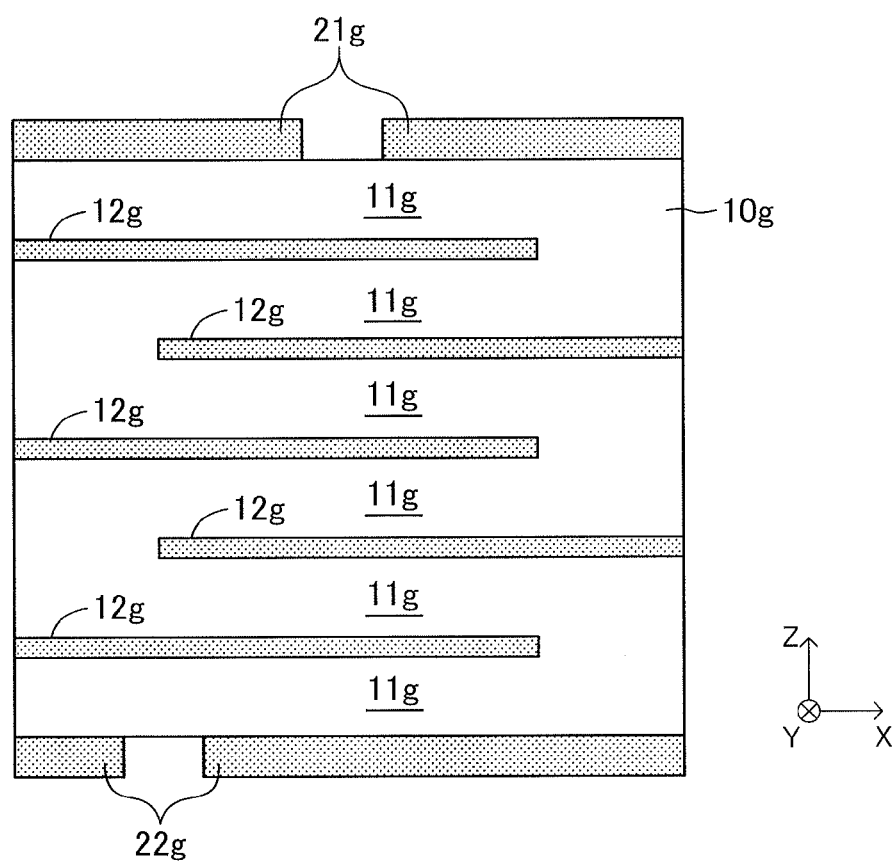
FIG. 7 is a cross-sectional view corresponding to FIG. 2 of one piezoelectric device corresponding part in the state illustrated in FIG. 5.

FIG. 7 illustrates a cross section of the extracted one green piezoelectric device corresponding part that corresponds to FIG. 2. As illustrated in FIG. 7, in this example, the green piezoelectric device corresponding part includes a green laminated body 10g that corresponds to the main body part 10, a green top surface electrode 21g that is formed on the top surface of the green laminated body 10g and corresponds to the top surface electrode 21, and a green bottom surface electrode 22g that is formed on the bottom surface of the green laminated body 10g and corresponds to the bottom surface electrode 22. The green laminated body 10g is a laminated body in which piezoelectric sheets 11g are disposed as the top layer and the bottom layer, and the piezoelectric sheets 11g and electrode films 12g are alternately laminated.

As illustrated in FIG. 7, in the green piezoelectric device corresponding part extracted by the above-mentioned machining process, an intersection between the top surface and the side surface (which is a surface exposed by the machining process) (edge of top surface) is liable to be a sharp angle shape. Alternatively, a burr or the like is liable to occur in the intersection.

Figure 8:
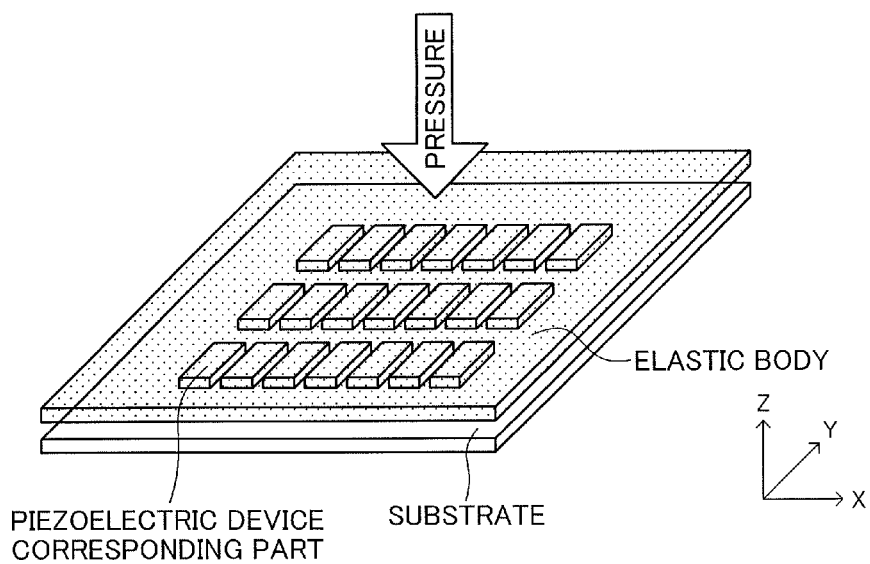
FIG. 8 is a diagram illustrating a state in which an elastic body is pressed from above to the multiple piezoelectric device corresponding parts placed on the substrate.
Figure 9:
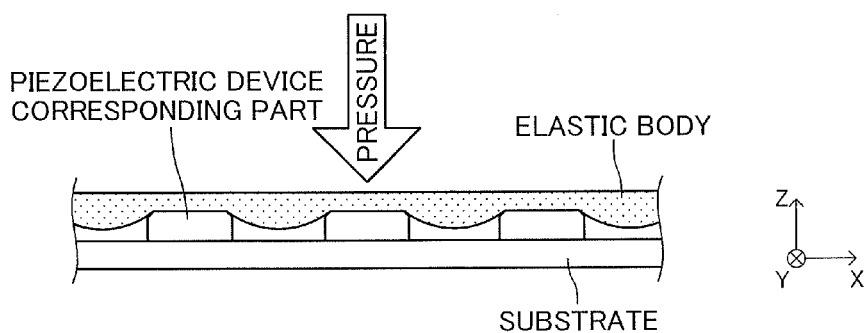
FIG. 9 is a diagram when the state illustrated in FIG. 8 is viewed from side.

Next, as illustrated in FIGS. 8 and 9, a tabular elastic body is pressed from above to the plurality of green piezoelectric device corresponding parts placed on the substrate. The elastic body is made of a material such as silicone rubber, and has a hardness of 15 to 50 in Shore hardness A. In addition, a pressure (pressing force per unit area) pressing the elastic body is 5 to 40 kgf/cm$^2$. In addition, an interval (gap width) between neighboring green piezoelectric device corresponding parts is 0.5 to 5.0 mm in this example.

Figure 10:
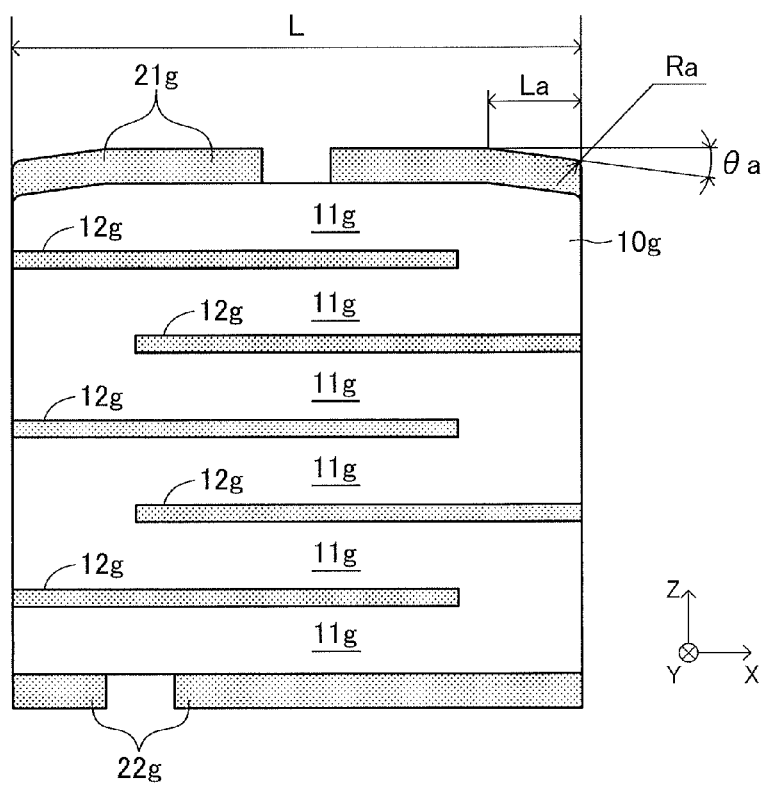
FIG. 10 is a diagram illustrating a state in which an inclined part is formed at an edge of the top surface of the piezoelectric device corresponding part illustrated in FIG. 7.

As illustrated in FIG. 9, on the bottom surface of the pressed elastic body, "parts corresponding to gaps between neighboring green piezoelectric device corresponding parts" enter (expand downward) into the gaps due to the elastic deformation based on the pressure. Along with this, as illustrated in FIG. 10, the edge of the top surface (square frame viewed from above) of the green piezoelectric device corresponding part is deformed along the shape (contour) of the bottom surface of the deformed elastic body. As a result, the inclined part declined toward the outside is formed on the edge of the top surface of the green piezoelectric device corresponding part, and the circular arc part is formed at the intersection between the inclined part and the side surface of the green piezoelectric device corresponding part (edge of the inclined part). Thus, the above-mentioned "sharp angle shape" and "burr or the like" can be easily removed from the edges of the top surfaces of the plurality of green piezoelectric device corresponding parts in the same process.

As illustrated in FIG. 10, a length La of the inclined part when the green piezoelectric device corresponding part is viewed from above is 0.01 to 1.0 mm. An inclination angle θa of the inclined part is 0.1 to 15.0°. A radius Ra of the circular arc part is 0.002 to 0.020 mm. Further, the inclined part may be eliminated.

Figure 11:
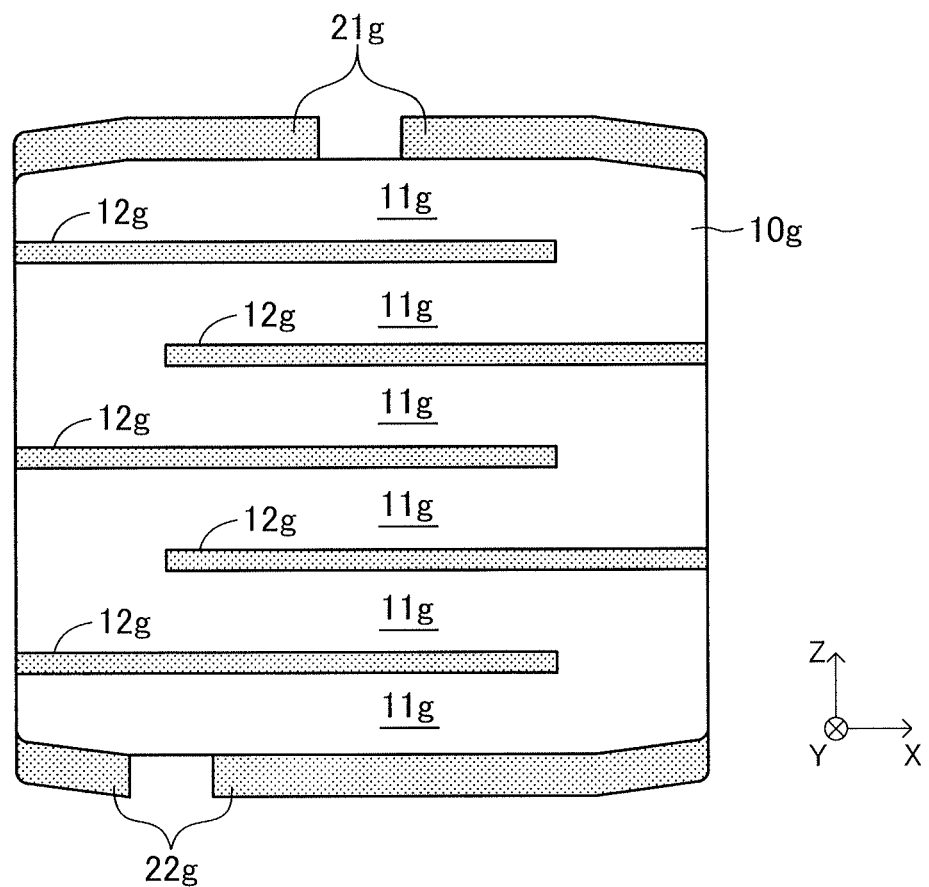
FIG. 11 is a diagram illustrating a state in which an inclined part is formed also at an edge of the bottom surface of the piezoelectric device corresponding part illustrated in FIG. 10.

The above-mentioned formation of the inclined part and the circular arc part is also performed at the edge of the bottom surface (square frame viewed from below) of the green piezoelectric device corresponding part. Specifically, after the process illustrated in FIGS. 8 and 9, each of the plurality of green piezoelectric device corresponding parts placed on the substrate is reversed upside down and is replaced on the substrate at the same position. Then, in the same manner as the process illustrated in FIGS. 8 and 9, the tabular elastic body is pressed from above to the plurality of green piezoelectric device corresponding parts placed on the substrate. As a result, as illustrated in FIG. 11, the inclined part and the circular arc part are formed also at the edge of the bottom surface (square frame viewed from below) of the green piezoelectric device corresponding part, similarly to the edge of the top surface of the green piezoelectric device corresponding part.

Figure 12:
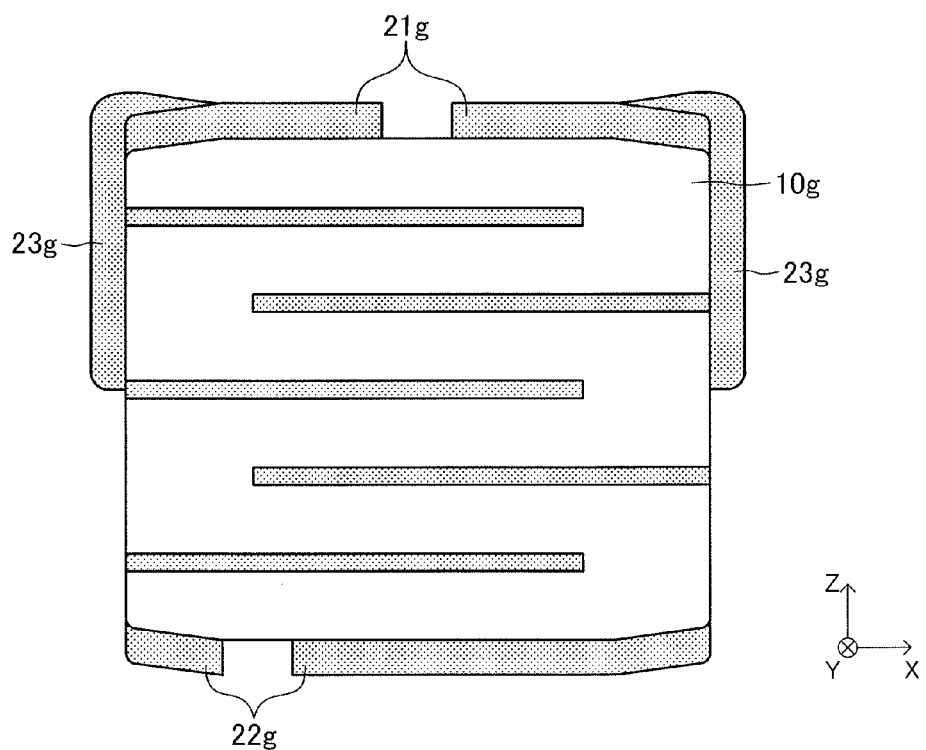
FIG. 12 is a diagram illustrating a state in which an upper half of a green side surface electrode is formed on the piezoelectric device corresponding part illustrated in FIG. 11.

Next, as illustrated in FIG. 12, at a predetermined place on the upper half of the side surface of the green piezoelectric device corresponding part, a green side surface electrode 23g corresponding to the side surface electrode 23 is formed so as to overlap the edge of the green top surface electrode 21g. This formation is performed by forming the paste containing the electrode material by using one of known methods such as screen printing.

Figure 13:
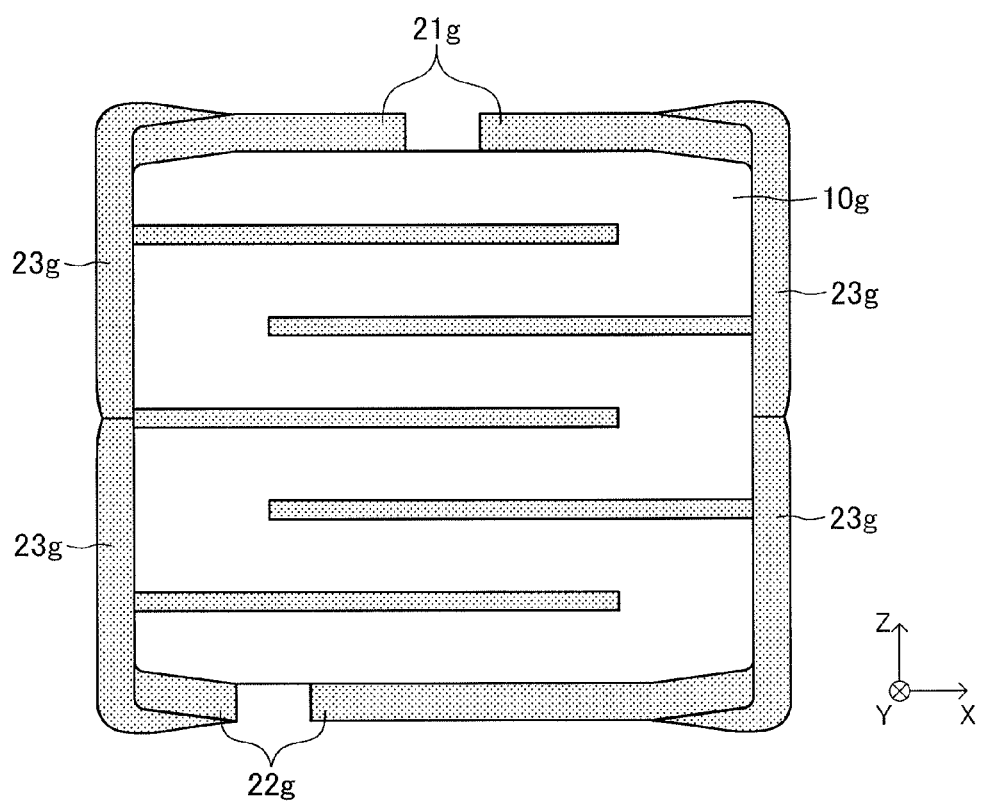
FIG. 13 is a diagram illustrating a state in which a lower half of the green side surface electrode is formed on the piezoelectric device corresponding part illustrated in FIG. 12.

Next, as illustrated in FIG. 13, at a predetermined place on the lower half of the side surface of the green piezoelectric device corresponding part, the green side surface electrode 23g corresponding to the side surface electrode 23 is formed so as to overlap the edge of the green bottom surface electrode 22g. This formation is performed by forming the paste containing the electrode material by using one of known methods such as screen printing as well.

Then, the green piezoelectric device corresponding part illustrated in FIG. 13 is sintered at a predetermined temperature for a predetermined period of time. As a result, the piezoelectric device (after sintering) illustrated in FIGS. 1 and 2 is obtained.

(Action and Effect of Forming Inclined Part and Circular Arc Part by Pressing Elastic Body)

Next, there is described an experiment performed for confirming the action and effect of forming the inclined part and the circular arc part by pressing the elastic body.

In this experiment, a sample of the piezoelectric device produced by using the above-mentioned production method was used, in which a thickness of the piezoelectric layer 11 was 20.0 μm, a thickness of the internal electrode 12 was 2.0 μm, the number of the piezoelectric layers 11 was ten, an average thickness of the external electrode 20 (the top surface electrode 21, the bottom surface electrode 22, and the side surface electrode 23) was 4.0 μm, the entire dimensions were 2.0 mm in depth, 1.0 mm in width, and 0.2 mm in height, and the sintering temperature was 1,200° C. The individual values are values after sintering.

Figure 14:
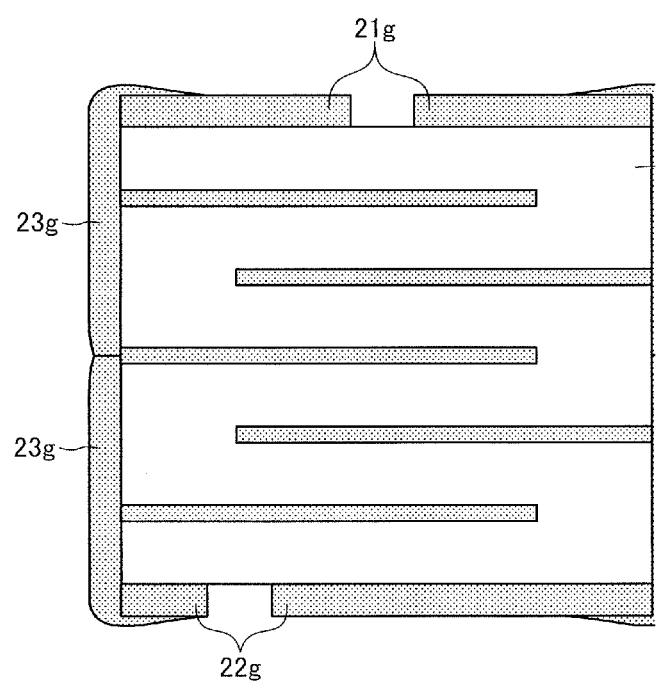
FIG. 14 is a diagram of a comparative example corresponding to FIG. 13, in which the green side surface electrode is formed in a state where the elastic body is not pressed from above.

As described above, in the sample of this embodiment, the green side surface electrode 23g is formed in the state where the above-mentioned inclined part and circular arc part are formed by pressing the elastic body. In contrast, in this experiment, as a comparative example, as illustrated in FIGS. 14 and 15 corresponding to FIGS. 13 and 3, respectively, there was introduced a sample in which the green side surface electrode 23g was formed in a state where the elastic body was not pressed (namely, in a state where the above-mentioned "sharp angle shape" and "burr or the like" remained unremoved).

Figure 3:
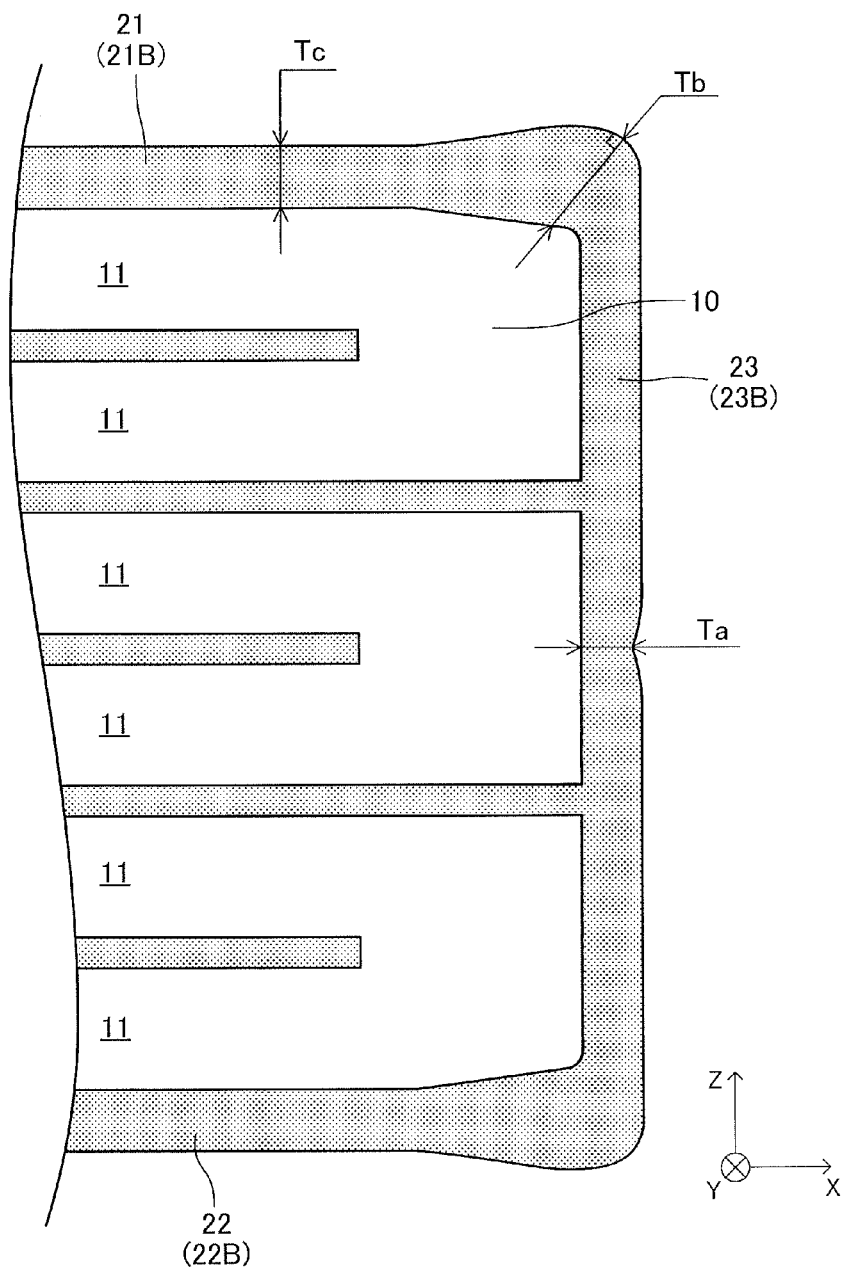
FIG. 3 is an enlarged view of a right half of the cross-sectional view illustrated in FIG. 2.
Figure 15:
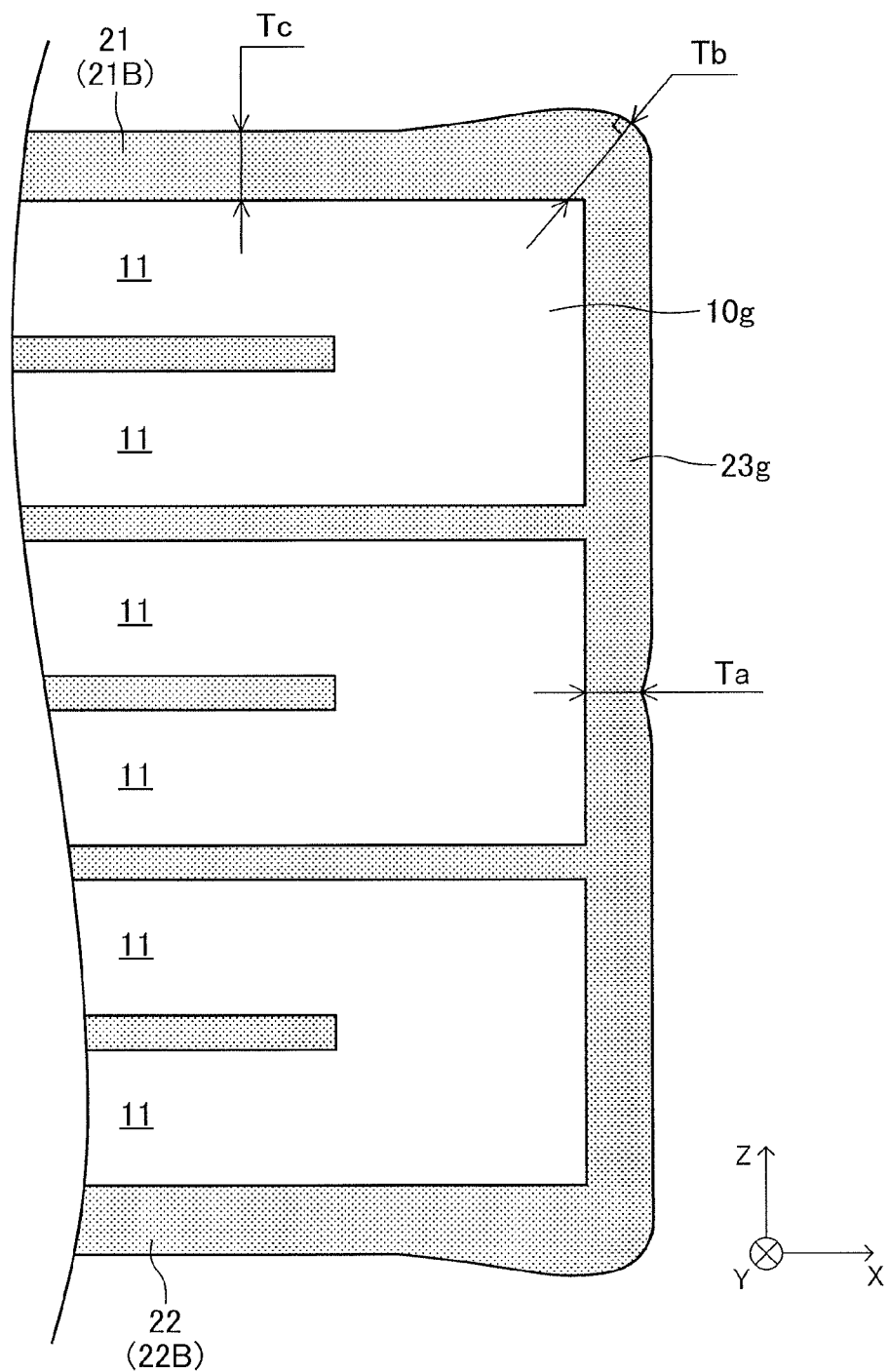
FIG. 15 is a diagram corresponding to FIG. 3 with respect to the comparative example illustrated in FIG. 14.

In this experiment, as a parameter, there was introduced a thickness ratio of Tb to Ta, namely Tb/Ta (see FIGS. 3 and 15 about Ta and Tb). As to the above-mentioned samples having different Tb/Ta values, conductivity between the top surface electrode 21 (or the bottom surface electrode 22) and the side surface electrode 23 of the piezoelectric device after sintering was evaluated. The evaluation of conductivity was performed by bringing a pair of terminals of a conductivity checker (tester) into contact with the top surface and bottom surface electrodes 21 and 22, respectively, which were connected by the side surface electrode 23. A result of the evaluation is shown in Table 1. In Table 1, "presence" of pressure by the elastic body (Level 9 to 16) corresponds to this embodiment, while "absence" of pressure by the elastic body (Level 1 to 8) corresponds to the comparative example.

TABLE 1

| Level | Presence or absence of pressure by elastic body | Ta | Tb | Tb/Ta | Evaluation of conductivity |
|---|---|---|---|---|---|
| 1 | Absence | 4.2 | 2.7 | 0.6 | x |
| 2 | ↑ | 3.6 | 2.1 | 0.6 | x |
| 3 | ↑ | 3.8 | 2.5 | 0.7 | x |
| 4 | ↑ | 2.9 | 2.3 | 0.8 | x |
| 5 | ↑ | 4.0 | 3.2 | 0.8 | x |
| 6 | ↑ | 2.5 | 1.9 | 0.8 | x |
| 7 | ↑ | 5.3 | 4.9 | 0.9 | x |
| 8 | ↑ | 4.9 | 4.4 | 0.9 | x |
| 9 | Presence | 4.8 | 5.3 | 1.1 | o |
| 10 | ↑ | 4.3 | 6.4 | 1.5 | o |
| 11 | ↑ | 4.8 | 8.6 | 1.8 | o |
| 12 | ↑ | 4.1 | 8.2 | 2.0 | o |
| 13 | ↑ | 4.1 | 10.3 | 2.5 | o |
| 14 | ↑ | 4.4 | 15.1 | 3.4 | o |
| 15 | ↑ | 2.7 | 11.5 | 4.3 | o |
| 16 | ↑ | 2.3 | 10.6 | 4.6 | o |

As understood from Table 1, Tb/Ta becomes 0.9 or smaller in the comparative example. Further, conduction failure is liable to occur between the top surface electrode 21 (or the bottom surface electrode 22) and the side surface electrode 23. It is considered that this is because a film thickness of the green side surface electrode 23g becomes relatively small in "a vicinity of a boundary between the green top surface electrode 21g and the green side surface electrode 23g" due to the presence of the above-mentioned "sharp angle shape" or "burr or the like".

In contrast, Tb/Ta becomes 1.1 to 4.6 in the embodiment. Further, conduction failure hardly occurs between the top surface electrode 21 (or the bottom surface electrode 22) and the side surface electrode 23. It is considered that this is because the film thickness of the green side surface electrode 23g becomes relatively small in "the vicinity of the boundary between the green top surface electrode 21g and the green side surface electrode 23g" due to removal of the above-mentioned "sharp angle shape" or "burr or the like".

As described above, the inclined part and the circular arc part are formed by pressing the elastic body, and hence the above-mentioned "sharp angle shape" or "burr or the like" can be easily removed by the same process. As a result, it is possible to produce a piezoelectric device (molded body prior to sintering) by a simple method, in which conduction failure hardly occurs between the top surface electrode 21 (or the bottom surface electrode 22) and the side surface electrode 23.

The present invention is not limited to the embodiment described above, and various modification examples can be adopted within the scope of the present invention. For instance, the main body part 10 is the laminated body in which the piezoelectric layers 11 and the internal electrodes 12 are alternately laminated in the embodiment described above, but the main body part 10 may be a piezoelectric body made of only a piezoelectric material (without the internal electrode). In addition, the main body part 10 may be a ceramics body made of only a ceramics material other than the piezoelectric material (without the internal electrode).

In addition, in the embodiment described above, the plurality of green piezoelectric device corresponding parts are placed on the substrate at intervals by performing the machining process on the "one tabular green compact including the plurality of green piezoelectric device corresponding parts at intervals" placed on the substrate. In contrast, the plurality of green piezoelectric device corresponding parts formed individually in advance may be placed on the substrate at intervals.

The invention claimed is:

1. A piezoelectric device being a sintered body, comprising:
a main body part comprising a part made of a piezoelectric material, the main body part having a surface comprising a flat top surface part, a flat bottom surface part, and a side surface part connecting the flat top surface part to the flat bottom surface part;
a top surface electrode that covers at least a part of the flat top surface part of the main body part;
a bottom surface electrode that covers at least a part of the flat bottom surface part of the main body part; and
a side surface electrode that covers at least a part of the side surface part of the main body part and connects the top surface electrode to the bottom surface electrode,
wherein Tb/Ta is 1.0 to 5.0, where Ta represents a thickness at a part of the side surface electrode where the thickness becomes minimum, and Tb represents a thickness at a part of the side surface electrode where a radius of curvature of a surface thereof becomes minimum.

2. A piezoelectric device according to claim 1, wherein:
the part of the side surface electrode where the thickness becomes minimum comprises a center part of the side surface electrode in an up and down direction; and
the part of the side surface electrode where the radius of curvature of the surface thereof becomes minimum comprises a part in a vicinity of a boundary between the side surface electrode and the top surface electrode or the bottom surface electrode.

3. A piezoelectric device according to claim 1, wherein Tc/Ta is 0.5 to 2.0, where Tc represents a thickness of the top surface electrode or the bottom surface electrode.

4. A piezoelectric device according to claim 1, wherein:
the main body part comprises a laminated body comprising at least one piezoelectric layer made of the piezoelectric material and at least one internal electrode that are laminated on each other; and
the internal electrode is connected to the side surface electrode.

5. A piezoelectric device according to claim 1, wherein the main body part has a rectangular parallelepiped shape having a depth of 0.4 to 10.0 mm, a width of 0.2 to 10.0 mm, and a height of 0.3 to 10.0 mm.

6. A production method for a green compact being a molded body prior to sintering of a piezoelectric device being a sintered body,
the piezoelectric device comprising:
a main body part comprising a part made of a piezoelectric material, the main body part having a surface comprising a flat top surface part, a flat bottom surface part, and a side surface part connecting the flat top surface part to the flat bottom surface part;
a top surface electrode that covers at least a part of the flat top surface part of the main body part;
a bottom surface electrode that covers at least a part of the flat bottom surface part of the main body part; and
a side surface electrode that covers at least a part of the side surface part of the main body part and connects the top surface electrode to the bottom surface electrode, wherein Tb/Ta is 1.0 to 5.0, where Ta represents a thickness at a part of the side surface electrode where the thickness becomes minimum, and Tb represents a thickness at a part of the side surface electrode where a radius of curvature of a surface thereof becomes minimum, the production method comprising:

a first step of placing a plurality of green compacts on a tabular substrate at intervals, the plurality of green compacts each comprising a green main body part that corresponds to the main body part and a green top surface electrode that is formed on a top surface of the green main body part and corresponds to the top surface electrode;

a second step of pressing an elastic body from above to the plurality of green compacts, so as to form an inclined part declined toward an outer side in an edge of a top surface of each of the plurality of green compacts, and to form a circular arc part at an intersection between the inclined part and a side surface of the each of the plurality of green compacts, the second step being performed after the first step; and a third step of forming, on the side surface of the each of the plurality of green compacts, a green side surface electrode that corresponds to the side surface electrode so that the green side surface electrode is connected to the green top surface electrode, the third step being performed after the second step.

7. A production method for a green compact according to claim 6, wherein:

the plurality of green compacts placed on the tabular substrate have the same height, and the elastic body has a plate-like shape;

the elastic body has a hardness of 15 to 50 in Shore hardness A;

the elastic body is pressed by a pressure of 5 to 40 kgf/cm$^2$;

the inclined part has a length of 0.01 to 1.0 mm when the each of the plurality of green compacts is viewed from above;

the inclined part has an inclination angle of 0.1 to 15.0°; and the circular arc part has a radius of 0.002 to 0.020 mm.

8. A production method for a green compact according to claim 6, wherein the first step comprises placing the plurality of green compacts on the tabular substrate at intervals by performing a machining process on one tabular green compact placed on the tabular substrate, the one tabular green compact comprising parts that correspond to the plurality of green compacts at intervals.

9. A production method for a green compact being a molded body prior to sintering of a piezoelectric device being a sintered body, the piezoelectric device comprising:

a main body part comprising a part made of a piezoelectric material, the main body part having a surface comprising a flat top surface part, a flat bottom surface part, and a side surface part connecting the flat top surface part to the flat bottom surface part;

a top surface electrode that covers at least a part of the flat top surface part of the main body part;

a bottom surface electrode that covers at least a part of the flat bottom surface part of the main body part; and a side surface electrode that covers at least a part of the side surface part of the main body part and connects the top surface electrode to the bottom surface electrode, wherein Tb/Ta is 1.0 to 5.0, where Ta represents a thickness at a part of the side surface electrode where the thickness becomes minimum, and Tb represents a thickness at a part of the side surface electrode where a radius of curvature of a surface thereof becomes minimum, the production method comprising:

a first step of placing a plurality of green compacts on a tabular substrate at intervals, the plurality of green compacts each comprising a green main body part that corresponds to the main body part, a green top surface electrode that is formed on a top surface of the green main body part and corresponds to the top surface electrode, and a green bottom surface electrode that is formed on a bottom surface of the green main body part and corresponds to the bottom surface electrode;

a second step of pressing an elastic body from above to the plurality of green compacts, so as to form an inclined part declined toward an outer side in an edge of a top surface of each of the plurality of green compacts, and to form a circular arc part at an intersection between the inclined part and a side surface of the each of the plurality of green compacts, the second step being performed after the first step;

a third step of reversing the plurality of green compacts upside down, placing the plurality of green compacts again on the tabular substrate at intervals, and pressing an elastic body from above to the plurality of green compacts, so as to form an inclined part declined toward an outer side in an edge of a top surface of the each of the plurality of green compacts, and to form a circular arc part at an intersection between the inclined part and a side surface of the each of the plurality of green compacts, the third step being performed after the second step; and a fourth step of forming, on the side surface of the each of the plurality of green compacts, a green side surface electrode that corresponds to the side surface electrode so as to connect the green top surface electrode to the green bottom surface electrode, the fourth step being performed after the third step.

10. A production method for a green compact according to claim 9, wherein:

the plurality of green compacts placed on the tabular substrate have the same height, and the elastic body has a plate-like shape;

the elastic body has a hardness of 15 to 50 in Shore hardness A;

the elastic body is pressed by a pressure of 5 to 40 kgf/cm$^2$;

the inclined part has a length of 0.01 to 1.0 mm when the each of the plurality of green compacts is viewed from above;

the inclined part has an inclination angle of 0.1 to 15.0°; and the circular arc part has a radius of 0.002 to 0.020 mm.

11. A production method for a green compact according to claim 9, wherein the first step comprises placing the plurality of green compacts on the tabular substrate at intervals by performing a machining process on one tabular green compact placed on the tabular substrate, the one tabular green compact comprising parts that correspond to the plurality of green compacts at intervals.

12. A production method for a green compact being a molded body prior to sintering of a piezoelectric device being a sintered body,
the piezoelectric device comprising:
a main body part comprising a part made of a piezoelectric material, the main body part having a surface comprising a flat top surface part, a flat bottom surface part, and a side surface part connecting the flat top surface part to the flat bottom surface part;
a top surface electrode that covers at least a part of the flat top surface part of the main body part;
a bottom surface electrode that covers at least a part of the flat bottom surface part of the main body part; and
a side surface electrode that covers at least a part of the side surface part of the main body part and connects the top surface electrode to the bottom surface electrode,
wherein Tb/Ta is 1.0 to 5.0 where Ta represents a thickness at a part of the side surface electrode where the thickness becomes minimum, and Tb represents a thickness at a part of the side surface electrode where a radius of curvature of a surface thereof becomes minimum,
the production method comprising:
a first step of placing a plurality of green compacts on a tabular substrate at intervals, the plurality of green compacts each comprising a green main body part that corresponds to the main body part and a green top surface electrode that is formed on a top surface of the green main body part and corresponds to the top surface electrode;
a second step of pressing an elastic body from above to the plurality of green compacts, so as to form a circular arc part at an intersection between an edge of a top surface of each of the plurality of green compacts and a side surface of the each of the plurality of green compacts, the second step being performed after the first step; and
a third step of forming, on the side surface of the each of the plurality of green compacts, a green side surface electrode that corresponds to the side surface electrode so that the green side surface electrode is connected to the green top surface electrode, the third step being performed after the second step.

13. A production method for a green compact according to claim 12, wherein:
the plurality of green compacts placed on the tabular substrate have the same height, and the elastic body has a plate-like shape;
the elastic body has a hardness of 15 to 50 in Shore hardness A;
the elastic body is pressed by a pressure of 5 to 40 kgf/cm$^2$; and
the circular arc part has a radius of 0.002 to 0.020 mm.

14. A production method for a green compact according to claim 12, wherein the first step comprises placing the plurality of green compacts on the tabular substrate at intervals by performing a machining process on one tabular green compact placed on the tabular substrate, the one tabular green compact comprising parts that correspond to the plurality of green compacts at intervals.

15. A production method for a green compact being a molded body prior to sintering of a piezoelectric device being a sintered body,
the piezoelectric device comprising:
a main body part comprising a part made of a piezoelectric material, the main body part having a surface comprising a flat top surface part, a flat bottom surface part, and a side surface part connecting the flat top surface part to the flat bottom surface part;
a top surface electrode that covers at least a part of the flat top surface part of the main body part;
a bottom surface electrode that covers at least a part of the flat bottom surface part of the main body part; and
a side surface electrode that covers at least a part of the side surface part of the main body part and connects the top surface electrode to the bottom surface electrode,
wherein Tb/Ta is 1.0 to 5.0, where Ta represents a thickness at a part of the side surface electrode where the thickness becomes minimum, and Tb represents a thickness at a part of the side surface electrode where a radius of curvature of a surface thereof becomes minimum,
the production method comprising:
a first step of placing a plurality of green compacts on a tabular substrate at intervals, the plurality of green compacts each comprising a green main body part that corresponds to the main body part, a green top surface electrode that is formed on a top surface of the green main body part and corresponds to the top surface electrode, and a green bottom surface electrode that is formed on a bottom surface of the green main body part and corresponds to the bottom surface electrode;
a second step of pressing an elastic body from above to the plurality of green compacts, so as to form a circular arc part at an intersection between an edge of a top surface of each of the plurality of green compacts and a side surface of the each of the plurality of green compacts, the second step performed after the first step;
a third step of reversing the plurality of green compacts upside down, placing the plurality of green compacts again on the tabular substrate at intervals, and pressing an elastic body from above to the plurality of green compacts, so as to form a circular arc part at an intersection between an edge of a top surface of the each of the plurality of green compacts and a side surface of the each of the plurality of green compacts, the third step being performed after the second step; and
a fourth step of forming, on the side surface of the each of the plurality of green compacts, a green side surface electrode that corresponds to the side surface electrode so as to connect the green top surface electrode to the green bottom surface electrode, the fourth step being performed after the third step.

16. A production method for a green compact according to claim 15, wherein:
the plurality of green compacts placed on the tabular substrate have the same height, and the elastic body has a plate-like shape;
the elastic body has a hardness of 15 to 50 in Shore hardness A;
the elastic body is pressed by a pressure of 5 to 40 kgf/cm$^2$; and
the circular arc part has a radius of 0.002 to 0.020 mm.

17. A production method for a green compact according to claim 15, wherein the first step comprises placing the plurality of green compacts on the tabular substrate at intervals by performing a machining process on one tabular green compact placed on the tabular substrate, the one tabular green compact comprising parts that correspond to the plurality of green compacts at intervals.

* * * * *